US012648487B2

(12) United States Patent
Lee et al.

(10) Patent No.: US 12,648,487 B2
(45) Date of Patent: Jun. 2, 2026

(54) SEMICONDUCTOR PACKAGE INCLUDING BUFFER CHIP BONDED TO MEMORY DIES USING WIRES

(71) Applicant: SAMSUNG ELECTRONICS CO., LTD., Suwon-si (KR)

(72) Inventors: Manho Lee, Suwon-si (KR); Jungmin Seo, Suwon-si (KR); Kwangseob Shin, Suwon-si (KR); Woosin Choi, Suwon-si (KR); Junghwan Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 297 days.

(21) Appl. No.: 18/206,201

(22) Filed: Jun. 6, 2023

(65) Prior Publication Data

US 2024/0055395 A1     Feb. 15, 2024

(30) Foreign Application Priority Data

Aug. 10, 2022 (KR) ........................ 10-2022-0100182
Oct. 5, 2022 (KR) ........................ 10-2022-0127169

(51) Int. Cl.
*H01L 25/065* (2023.01)
*H01L 23/00* (2006.01)
*H10B 80/00* (2023.01)

(52) U.S. Cl.
CPC .......... *H01L 25/0652* (2013.01); *H01L 24/49* (2013.01); *H10B 80/00* (2023.02); *H01L 2224/49052* (2013.01); *H01L 2224/49096*

(2013.01); *H01L 2225/06506* (2013.01); *H01L 2225/0651* (2013.01); *H01L 2225/06562* (2013.01)

(58) Field of Classification Search
CPC .................. H01L 2225/06562; H01L 25/0652
See application file for complete search history.

(56) References Cited

U.S. PATENT DOCUMENTS

| | | | |
|---|---|---|---|
| 8,415,808 B2 | 4/2013 | Liao et al. | |
| 8,890,330 B2 | 11/2014 | Kim et al. | |
| 9,263,105 B2 | 2/2016 | Jeon et al. | |
| 10,249,592 B2 | 4/2019 | Mostovoy et al. | |
| 11,017,877 B2 | 5/2021 | Na et al. | |

(Continued)

FOREIGN PATENT DOCUMENTS

| | | |
|---|---|---|
| KR | 10-1676713 B1 | 11/2016 |
| KR | 1020210090521 A | 7/2021 |

(Continued)

*Primary Examiner* — Yu-Hsi D Sun
(74) *Attorney, Agent, or Firm* — Muir Patent Law, PLLC

(57) ABSTRACT

A buffer chip is wire-bonded to memory dies. A semiconductor package includes a semiconductor die stack, a first set of wire bonds connected to a first set of semiconductor dies, a second set of wire bonds connected to a second set of semiconductor dies, and the buffer chip. The second set of semiconductor dies are on the first set of semiconductor dies. The buffer chip includes a first set of die bond pads being close to the semiconductor die stack, and a second set of die bond pads being distant from the semiconductor die stack. The second set of wire bonds extends to the first set of die bond pads of the buffer chip, and the first set of wire bonds extends to the second set of die bond pads of the buffer chip.

20 Claims, 10 Drawing Sheets

(56)     References Cited

U.S. PATENT DOCUMENTS

| | | | |
|---|---|---|---|
| 11,315,905 B2 | 4/2022 | Park | |
| 11,362,063 B2 | 6/2022 | Xing et al. | |
| 2021/0242171 A1* | 8/2021 | Lee | G11C 5/04 |
| 2022/0076712 A1* | 3/2022 | Park | H01L 25/0657 |
| 2024/0179925 A1* | 5/2024 | Sung | H01L 25/18 |
| 2024/0250066 A1* | 7/2024 | Baek | H01L 25/105 |

FOREIGN PATENT DOCUMENTS

| | | |
|---|---|---|
| KR | 1020220000285 A | 1/2022 |
| KR | 10-2379092 B1 | 3/2022 |
| KR | 1020220055112 A | 5/2022 |

* cited by examiner

SEMICONDUCTOR PACKAGE INCLUDING BUFFER CHIP BONDED TO MEMORY DIES USING WIRES

CROSS-REFERENCE TO RELATED APPLICATIONS

Korean Patent Application No. 10-2022-0100182, filed on Aug. 10, 2022, in the Korean Intellectual Property Office, and Korean Patent Application No. 10-2022-0127169, filed on Oct. 5, 2022, in the Korean Intellectual Property Office, are incorporated by reference herein in their entireties.

BACKGROUND

1. Field

A semiconductor device, particularly, a semiconductor package including a buffer chip that is wire-bonded to memory dies is disclosed.

2. Description of the Related Art

Electronic devices include a plurality of integrated semiconductor circuits (or semiconductor chips) and thus have a complicated hardware configuration. To store data or instructions to be used by a host and/or perform computational operations, electronic devices generally include dynamic random access memories (DRAMs) as working memories or main memories and storage devices as recording media. A storage device may include a plurality of nonvolatile memories (NVMs).

SUMMARY

Embodiments are directed to a semiconductor package. The semiconductor package may include a package substrate, a semiconductor die stack, a first set of wire bonds, a second set of wire bonds, and a buffer chip. The semiconductor die stack may be mounted on the package substrate, and one or more semiconductor dies may be stacked in the semiconductor die stack. The semiconductor die stack may include a first set of semiconductor dies and a second set of semiconductor dies on the first set of semiconductor dies. The first set of wire bonds may connect the first set of semiconductor dies to each other. The second set of wire bonds may connect the second set of semiconductor dies to each other. The buffer chip may be mounted on the package substrate and may include a first set of die bond pads and a second set of die bond pads. The first set of die bond pads may be close to the semiconductor die stack, and the second set of die bond pads may be distant from the semiconductor die stack. The second set of wire bonds may extend to be connected to the first set of die bond pads of the buffer chip, and the first set of wire bonds may extend to be connected to the second set of die bond pads of the buffer chip.

Embodiments are also directed to a semiconductor package. The semiconductor package may include a package substrate, a semiconductor die stack, a first set of wire bonds, a second set of wire bonds, a third set of wire bonds, and a buffer chip. The semiconductor die stack may be mounted on the package substrate, and one or more semiconductor dies may be stacked in the semiconductor die stack. The semiconductor die stack may include a first set of semiconductor dies, a second set of semiconductor dies on the first set of semiconductor dies, and a third set of semiconductor dies on the second set of semiconductor dies.

The first set of wire bonds may connect the first set of semiconductor dies to each other. The second set of wire bonds may connect the second set of semiconductor dies to each other. The third set of wire bonds may connect the third set of semiconductor dies to each other. The buffer chip may be mounted on the package substrate and may include a first set of die bond pads, a second set of die bond pads, and a third set of die bond pads. The first set of die bond pads may be close to the semiconductor die stack, the second set of die bond pads may be between the first set of die bond pads and the third set of die bond pads, and the third set of die bond pads may be distant from the semiconductor die stack. The third set of wire bonds may extend to be connected to the first set of die bond pads of the buffer chip, the second set of wire bonds may extend to be connected to the second set of die bond pads of the buffer chip, and the first set of wire bonds may extend to be connected to the third set of die bond pads of the buffer chip.

Embodiments are also directed to a semiconductor package. The semiconductor package may include a package substrate, first and second semiconductor die stacks, a first set of wire bonds, a second set of wire bonds, a third set of wire bonds, a fourth set of wire bonds, and a buffer chip. The package substrate may include a first side surface in a first direction and a second side surface opposite the first side surface. The first and second semiconductor die stacks may each be mounted on the package substrate, and one or more semiconductor dies may be stacked in each of the first and second semiconductor die stack. The second semiconductor die stack may be apart from the first semiconductor die stack in the first direction. The first semiconductor die stack may include a first set of semiconductor dies and a second set of semiconductor dies on the first set of semiconductor dies. The second semiconductor die stack may include a third set of semiconductor dies and a fourth set of semiconductor dies on the third set of semiconductor dies. The first set of wire bonds may connect the first set of semiconductor dies to each other. The second set of wire bonds may connect the second set of semiconductor dies to each other. The third set of wire bonds may connect the third set of semiconductor dies to each other. The fourth set of wire bonds may connect the fourth set of semiconductor dies to each other. The buffer chip may be mounted on the package substrate and may include a first set of die bond pads, a second set of die bond pads, a third set of die bond pads, and a fourth set of die bond pads. The first set of die bond pads may be close to the first semiconductor die stack, and the second set of die bond pads may be distant from the first semiconductor die stack. The third set of die bond pads may be close to the second semiconductor die stack, and the fourth set of die bond pads may be distant from the second semiconductor die stack. The second set of wire bonds may extend to be connected to the first set of die bond pads of the buffer chip, the first set of wire bonds may extend to be connected to the second set of die bond pads of the buffer chip, the fourth set of wire bonds may extend to be connected to the third set of die bond pads of the buffer chip, and the third set of wire bonds may extend to be connected to the fourth set of die bond pads of the buffer chip.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
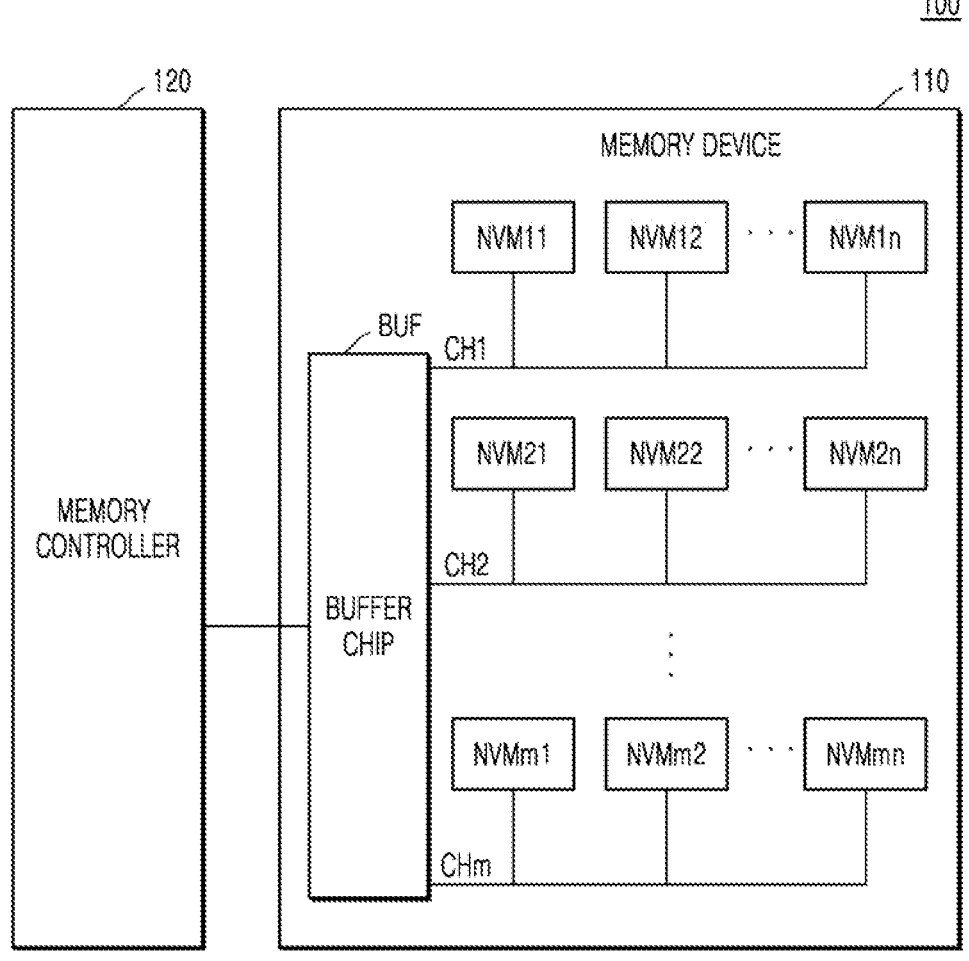
FIG. 1 is a block diagram illustrating a memory system according to example embodiments.

FIG. 1 is a block diagram illustrating a memory system according to example embodiments. Referring to FIG. 1, the memory system may be implemented as a storage device 100 including a nonvolatile memory device 110. The storage device 100 may include a memory controller 120 and the nonvolatile memory device 110 (hereinafter, simply referred to as the "memory device 110"). In an example embodiment, the storage device 100 may include a plurality of conceptual hardware parts. However, the storage device 100 and may have a different configuration. The memory controller 120 may control the memory device 110 in response to a write request from a host such that data may be written to the memory device 110. The memory controller 120 may control the memory device 110 in response to a read request from the host such that data stored in the memory device 110 may be read. The memory controller 120 may transmit commands, addresses, and/or data to the memory device 110 or may receive data from the memory device 110. Hereinafter, for ease of illustration, data may be referred to as DQ, and the terms "data" and "DQ" may be used interchangeably or together.

In some embodiments, the storage device 100 may be an internal memory embedded in an electronic device. In an implementation, the storage device 100 may be an embedded universal flash storage (UFS) memory device, an embedded multi-media card (eMMC), or a solid state drive (SSD). The storage device 100 may be a nonvolatile memory (i.e., a NAND flash memory), a vertical NAND flash memory (VNAND), a NOR flash memory, a resistive random access memory (RRAM), a phase change random access memory (PRAM), a magnetoresistive random access memory (MRAM), a ferroelectric random access memory (FRAM), a spin transfer torque random access memory (STT-RAM), or the like.

In some embodiments, the storage device 100 may be an external memory that may be attachable to an electronic device. In an implementation, the storage device 100 may include, e.g., UFS memory cards, CompactFlash (CF) cards, Secure Digital (SD) cards, Micro Secure Digital (Micro-SD) cards, Mini Secure Digital (Mini-SD) cards, extreme Digital (xD) cards, or memory sticks. As used herein, the term "or" is not an exclusive term, e.g., "A or B" would include A, B, or A and B.

The storage device 100 may support a plurality of channels CH1 to CHm that may be operable independently of each other. The storage device 100 may select, through each of the channels CH1 to CHm, one of memory dies connected to the channel, and may transmit/receive signals to/from the selected memory die. Therefore, the memory controller 120 may transmit/receive signals in parallel to/from memory dies selected through different channels.

The memory device 110 may include a plurality of memory dies NVM11 to NVMmn, and a buffer chip BUF. The memory dies NVM11 to NVMmn may be NAND flash memory dies. The memory dies NVM11 to NVMmn may be other types of memory dies such as DRAM dies. Each of the memory dies NVM11 to NVMmn may be connected to one of the channels CH1 to CHm. In an implementation, the memory dies NVM11 to NVM1$n$ may be connected to a first channel CH1, and the memory dies NVM21 to NVM2$n$ may be connected to a second channel CH2.

The buffer chip BUF may transmit signals between the memory controller 120 and the memory dies NVM11 to NVMmn. The buffer chip BUF may have a serializer/deserializer (SERDES) function for signal transmission paths between a narrow interface with the memory controller 120 and a wide interface with the memory dies NVM11 to NVMmn. In an implementation, the narrow interface may provide 8-bit data input/output, and the wide interface may provide 64-bit data input/output.

The buffer chip BUF may transmit commands, addresses, and/or data to a channel that is designated among the channels CH1 to CHm by a signal received from the memory controller 120. The buffer chip BUF may include a plurality of ports including receivers and drivers, and each of the ports may include an on-die termination (ODT) resistor. The buffer chip BUF may perform interfacing to provide frequencies, timing, and/or driving required for efficient communication between the memory controller 120 and the memory dies NVM11 to NVMmn, thereby improving the data input/output rate and signal characteristics of the memory device 110. The buffer chip BUF may also be referred to as a frequency boosting interface (FBI) buffer.

FIG. 1 illustrates that the storage device 100 may communicate with the memory controller 120 using the buffer chip BUF through m channels, and the storage device 100 may include n memory dies for each channel. However, the number of channels and the number of memory dies connected to each channel may be variously modified.

Figure 2:
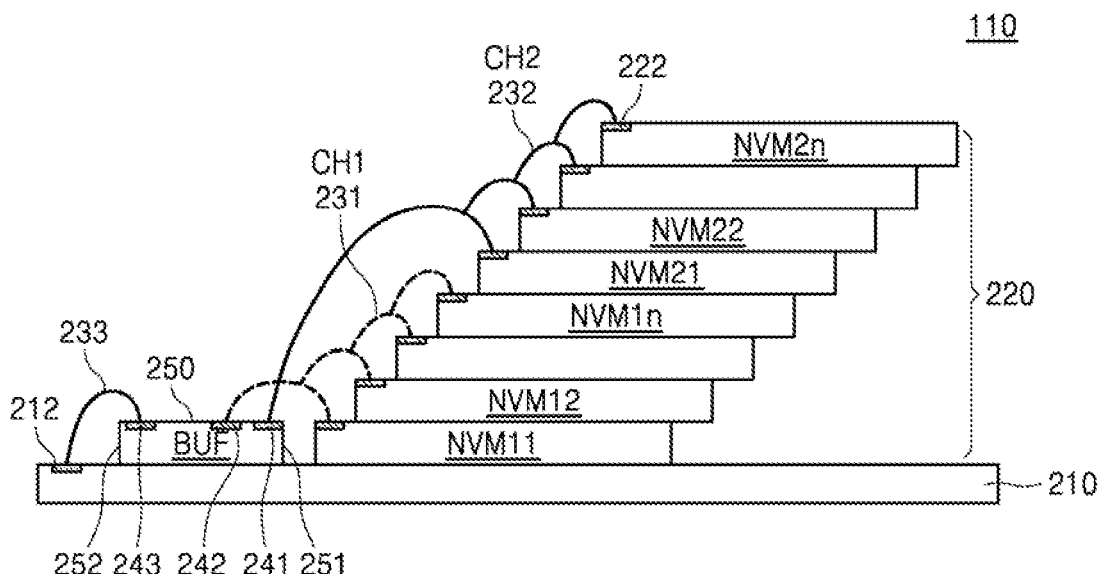
FIG. 2 is a view illustrating a semiconductor package according to example embodiments.

FIG. 2 is a view illustrating a semiconductor package according to example embodiments. FIG. 2 is a view illustrating an edge portion of the semiconductor package including the memory device 110 shown in FIG. 1.

Referring to FIGS. 1 and 2, in the semiconductor package including the memory device 110, the buffer chip BUF and a memory die stack 220 may be mounted on a package substrate 210. In the memory die stack 220, a first set of memory dies NVM11, NVM12, and NVM1$n$ connected to wire bonds 231 of the first channel CH1, and a second set of memory dies NVM21, NVM22, and NVM2$n$ connected to wire bonds 232 of the second channel CH2 may be stacked in a continuous offset stepped configuration. In the following embodiments, for ease of illustration, the memory dies NVM11, NVM12, NVM1$n$, NVM21, NVM22, and NVM2$n$ may be referred to as semiconductor dies NVM11, NVM12, NVM1$n$, NVM21, NVM22, and NVM2$n$, and the memory die stack 220 may be referred to as a semiconductor die stack 220. The terms "memory die" and "semiconductor die" may be interchangeably used.

The memory dies NVM11, NVM12, NVM1$n$, NVM21, NVM22, and NVM2$n$ may include die bond pads 222 aligned with edges of the memory dies NVM11, NVM12, NVM1$n$, NVM21, NVM22, and NVM2$n$. The die bond pads 222 of the first set of memory dies NVM11, NVM12, and NVM1$n$ may be electrically connected to die bond pads 242 of the buffer chip BUF through the wire bonds 231, and the die bond pads 222 of the second set of memory dies NVM21, NVM22, and NVM2$n$ may be electrically connected to die bond pads 241 of the buffer chip BUF through the wire bonds 232. The number of die bond pads 222 and the numbers of wire bonds 231 and 232 are briefly shown, and more die bond pads 222 and more wire bonds 231 and 232 than shown in FIG. 2 may be included in the semiconductor package. The wire bonds 231 and 232 may connect the die bond pads 222 to each other to establish wide interface connections between the memory dies NVM11, NVM12, NVM1*n*, NVM21, NVM22, and NVM2*n*.

The buffer chip BUF may be on the package substrate 210 at a distance from the memory die stack 220. The buffer chip BUF may include a plurality of die bond pads 241, 242, and 243 on a top surface 250 of the buffer chip BUF. Although the number of die bond pads 241, 242, and 243 of the buffer chip BUF is briefly shown in FIG. 2, the buffer chip BUF may include more die bond pads 241, 242, and 243 than shown in FIG. 2. The buffer chip BUF may include a first edge 251 and a second edge 252, and a surface between the first edge 251 and the second edge 252 may be set as the top surface 250. The first edge 251 may face the memory die stack 220, and the second edge 252 may be opposite the first edge 251. The first edge 251 may be closer to the memory die stack 220 than the second edge 252 may be to the memory die stack 220.

In the buffer chip BUF, a first set of die bond pads 241 may be arranged on a side of the first edge 251 of the buffer chip BUF, a second set of die bond pads 242 may be arranged between the first set of die bond pads 241 and a third set of die bond pads 243, and the third set of die bond pads 243 may be arranged on a side of the second edge 252 of the buffer chip BUF. The third set of die bond pads 243 may be bonded to contact pads 212 on the package substrate 210 to establish narrow interface connections between the package substrate 210 and the buffer chip BUF. The contact pads 212 on the package substrate 210 may be electrically connected to the memory controller 120.

In the memory device 110, the length of the wire bonds 232 connected to the second set of memory dies NVM21, NVM22, and NVM2*n* may be physically greater than the length of the wire bonds 231 connected to the first set of memory dies NVM11, NVM12 and NVM1*n*. The relatively long wire bonds 232 may have greater resistance and greater capacitance than the relatively short wire bonds 231. Therefore, signals transmitted through the relatively long wire bonds 232 may be delayed compared to signals transmitted through the relatively short wire bonds 231, and may thus have relatively poor electrical characteristics. To address this, the relatively long wire bonds 232 may be connected to the first set of die bond pads 241 of the buffer chip BUF that may be relatively close to the memory die stack 220, and the relatively short wire bonds 231 may be connected to the second set of die bond pads 242 of the buffer chip BUF that may be relatively distant from the memory die stack 220. In an implementation, as illustrated in FIG. 2, a, e.g., horizontal, distance between the first set of die bond pads 241 and an edge of the memory die stack 220 may be smaller than a, e.g., horizontal, distance between the second set of die bond pads 242 and the edge of the memory die stack 220. Hereinafter, the buffer chip BUF and wire bond schemes will be described with reference to FIGS. 3 to 10.

FIGS. 3 to 7 are perspective views illustrating semiconductor packages 110a to 110e each including memory dies, a buffer chip, and wire bonds according to example embodiments. The semiconductor packages 110a to 110e of FIGS. 3-7 are for illustrating wire bond schemes between a portion of the memory die stack 220 and the buffer chip BUF which are shown in FIG. 2.

Figure 3:
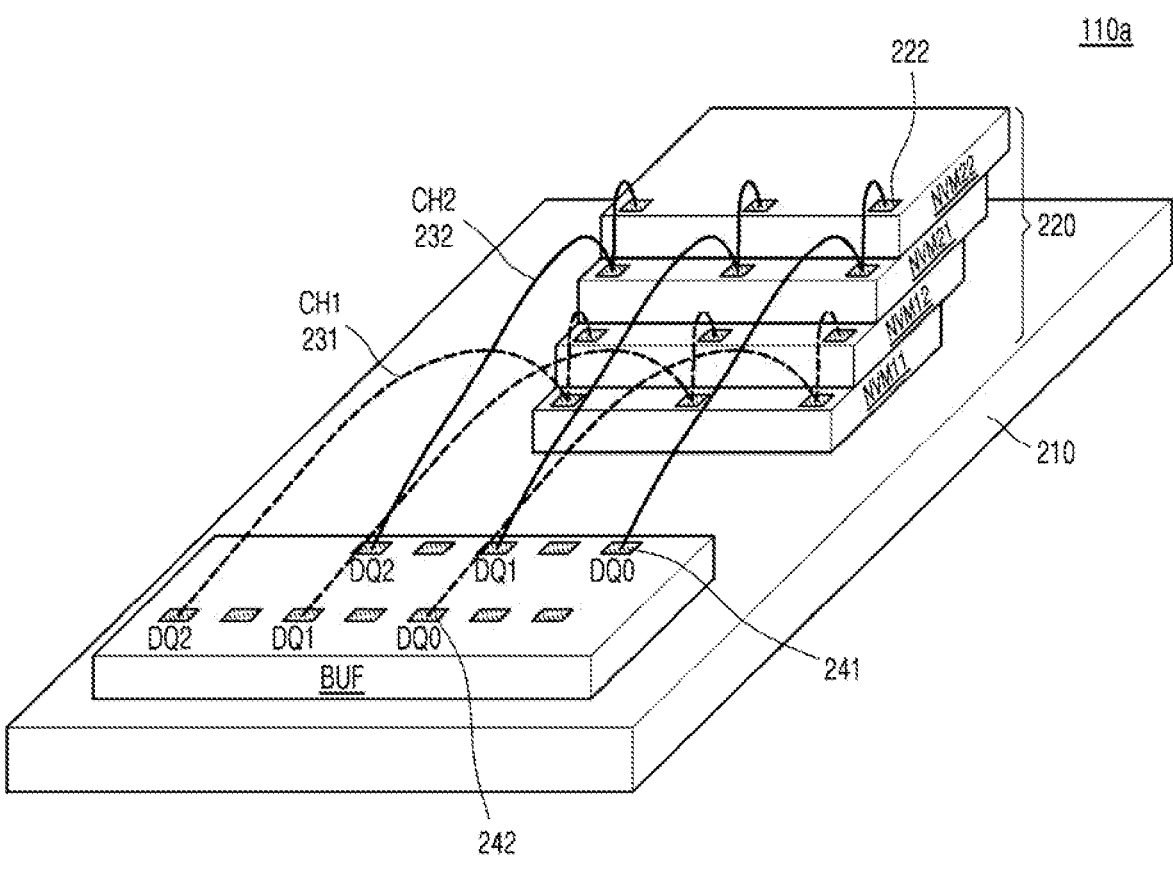
FIGS. 3 to 7 are perspective views illustrating semiconductor packages including memory dies, buffer chips, and wire bonds according to example embodiments.

In the semiconductor package 110a shown in FIG. 3, a buffer chip BUF may include a first set of die bond pads 241 that may be relatively close to a memory die stack 220 and a second set of die bond pads 242 that may be relatively distant from the memory die stack 220. In an implementation, the first set of die bond pads 241 may transmit data of a second channel CH2, and the second set of die bond pads 242 may transmit data of a first channel CH1. The first set of die bond pads 241 may be connected to wire bonds 232 connected to memory dies NVM21 and NVM22 of the second channel CH2 and may transmit data DQ of the memory dies NVM21 and NVM22. The second set of die bond pads 242 may be connected to wire bonds 231 connected to memory dies NVM11 and NVM12 of the first channel CH1 and may transmit data DQ of the memory dies NVM11 and NVM12.

As described above, the wire bonds 232 which may be relatively long and may be connected to the memory die stack 220 may be connected to the die bond pads 241 of the buffer chip BUF which may be relatively close to the memory die stack 220, and the wire bonds 231 which may be relatively short and may be connected to the memory die stack 220 may be connected to the die bond pads 242 of the buffer chip BUF which may be relatively distant from the memory die stack 220, thereby uniformizing electrical characteristics of the wire bonds 231 and 232 such as the resistance and capacitance of the wire bonds 231 and 232. Thus, electrical connections made by the wire bonds 231 and 232 between the buffer chip BUF and the memory die stack 220 may be improved.

Figure 4:
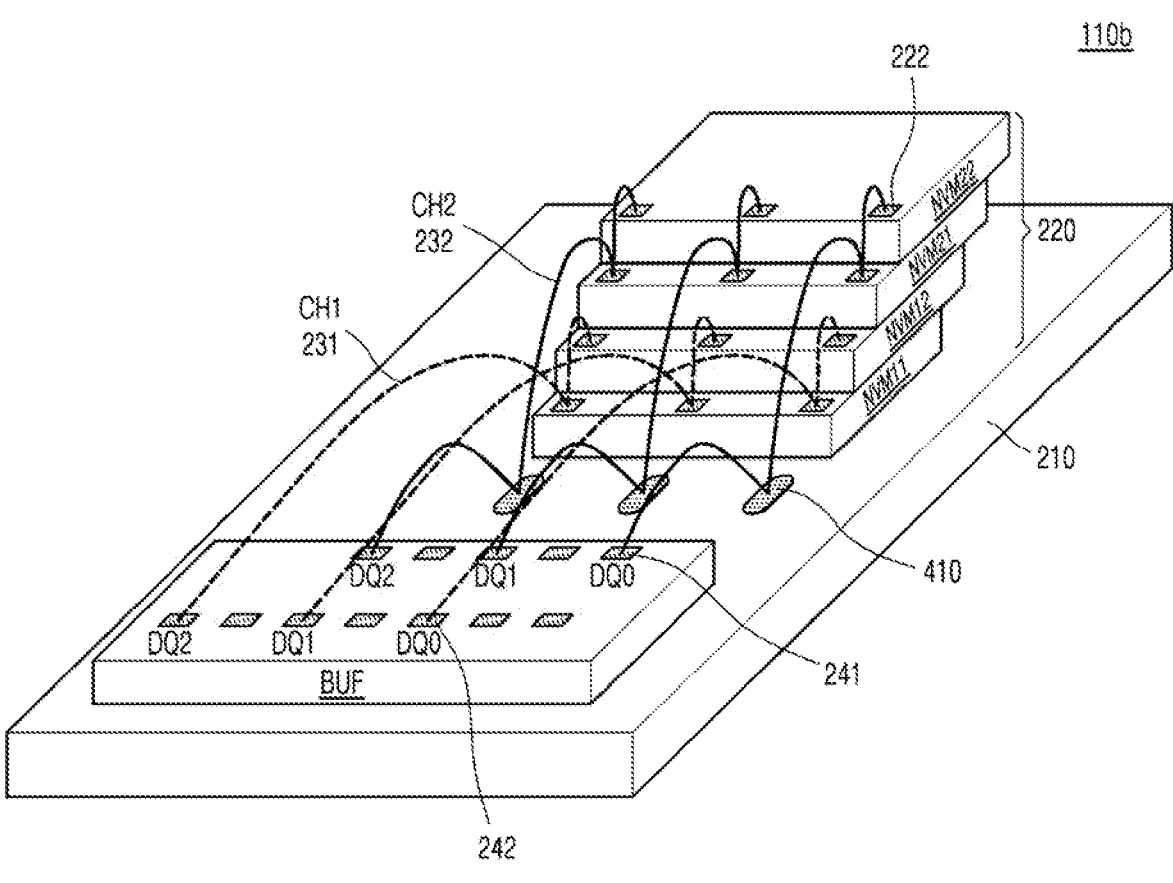

The semiconductor package 110b shown in FIG. 4 is similar to the semiconductor package 110a shown in FIG. 3. However, the semiconductor package 110b of the current embodiment may further include bond fingers 410 on a package substrate 210, and the bond fingers 410 may be arranged between a buffer chip BUF and the memory die stack 220. Relatively long wire bonds 232 connected to the memory die stack 220 may be partially bonded to the bond fingers 410 of the package substrate 210 and may extend such that the relatively long wire bonds 232 may be connected to the bond fingers 410 and die bond pads 241 of the buffer chip BUF. The relatively long wire bonds 232 may be connected to the die bond pads 241 of the buffer chip BUF via the bond fingers 410 of the package substrate 210. Therefore, sagging of the relatively long wire bonds 232 may be reduced, and thus a short circuit may be prevented between the relatively long wire bonds 232.

Figure 5:
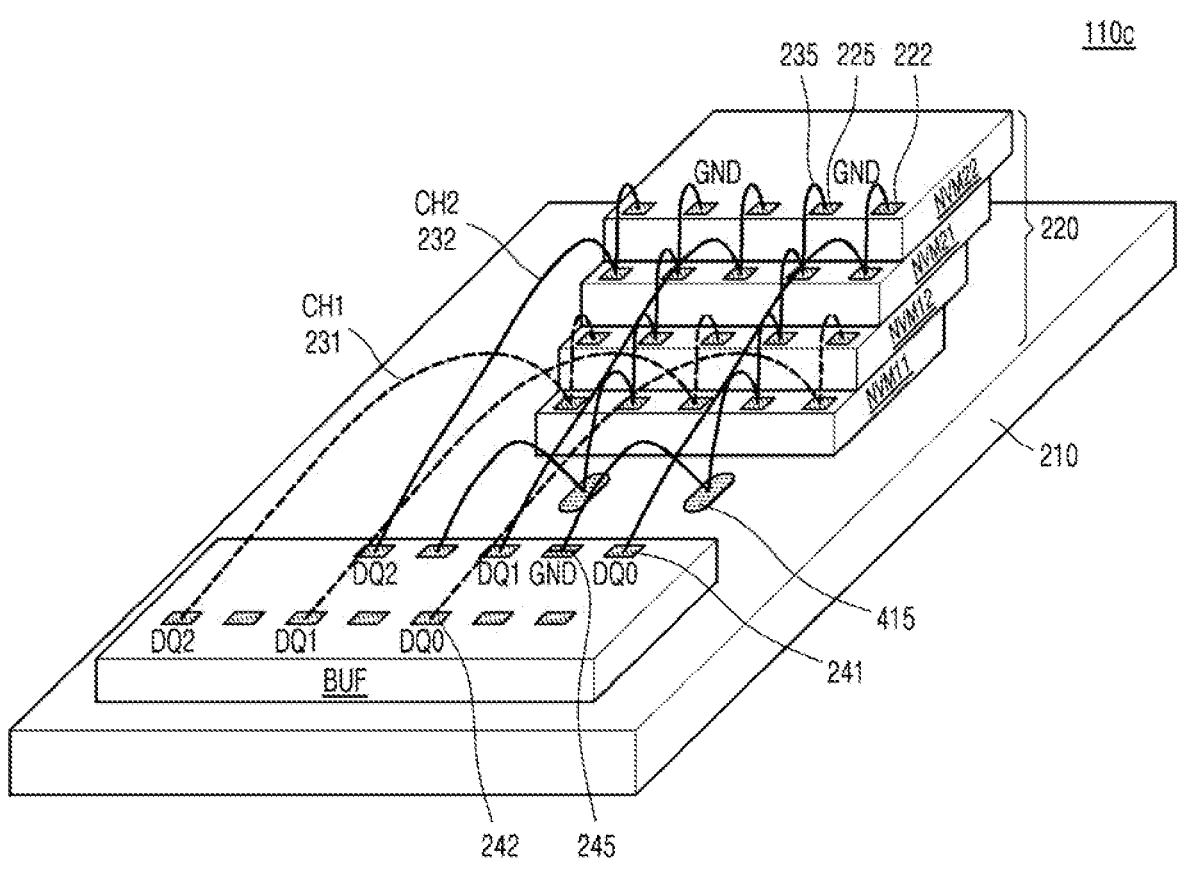

The semiconductor package 110c shown in FIG. 5 is similar to the semiconductor package 110a shown in FIG. 3. However, the semiconductor package 110c of the current embodiment may further include bond fingers 415 on a package substrate 210 die bond pads 225 providing ground voltage GND to memory dies NVM11 and NVM12 of a first channel CH1 and memory dies NVM21 and NVM22 of a second channel CH2 die bond pads 245 providing ground voltage GND to a buffer chip BUF and wire bonds 235 connecting the die bond pads 225 and 245 and the bond fingers 415 to each other. In each of memory dies NVM11, NVM12, NVM21, and NVM22, the die bond pads 225 configured to provide ground voltage GND may be arranged between die bond pads 222 configured to transmit signals including commands, addresses, and/or data DQ. The wire bonds 235 connected to the die bond pads 225 configured to provide ground voltage GND may provide a shield function such that wire bonds 231 and 232 configured to transmit signals may not be affected by signal interference. In the current embodiment, the die bond pads 222 configured to transmit data DQ and the die bond pads 225 configured to provide ground voltage GND may be alternately arranged. In other embodiments, however, one die bond pad 225 configured to provide ground voltage GND may be disposed for every two or more die bond pads 222 configured to transmit data DQ.

Figure 6:
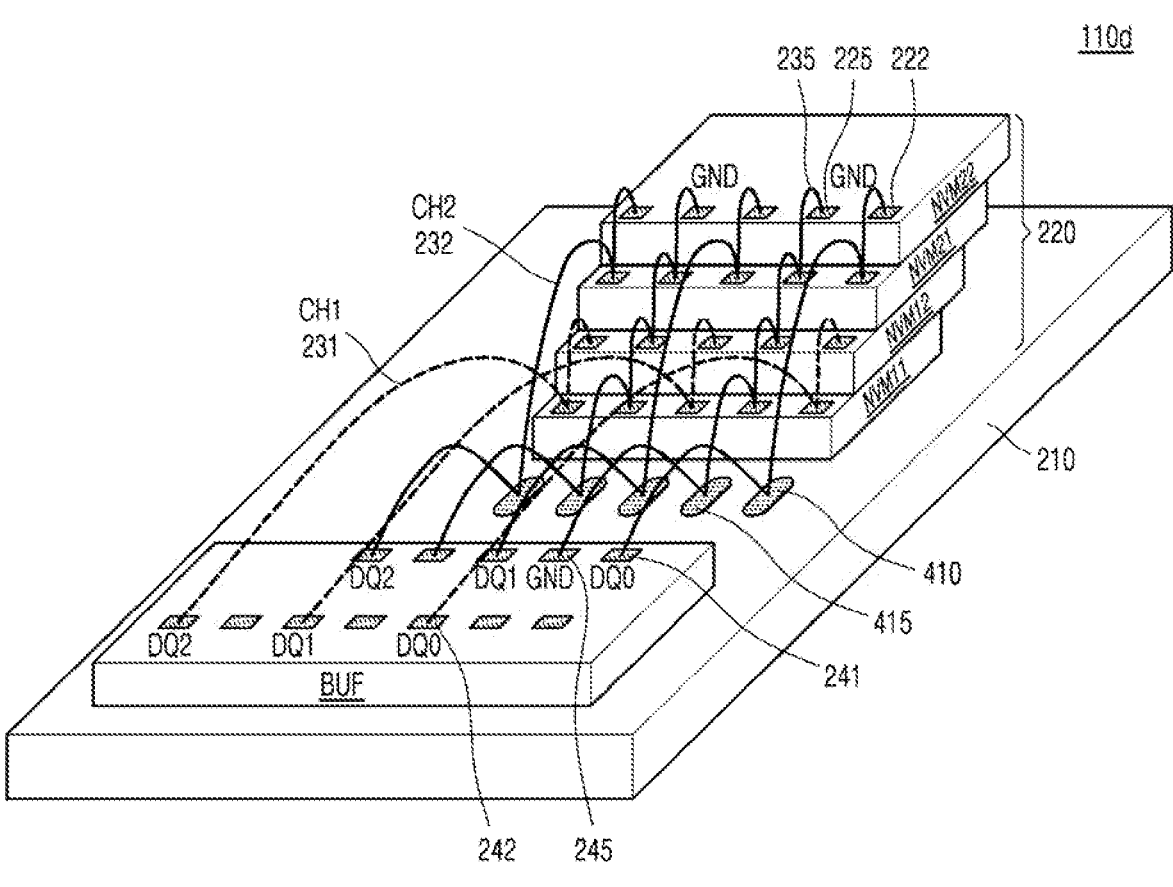

The semiconductor package 110d shown in FIG. 6 is similar to the semiconductor package 110b shown in FIG. 4. However, the semiconductor package 110d of the current embodiment may further include die bond pads 225 configured to provide ground voltage GND to memory dies NVM11, NVM12, NVM21, and NVM22 bond fingers 415 on a package substrate 210 die bond pads 245 configured to provide ground voltage GND to a buffer chip BUF and wire bonds 235 connecting the die bond pads 225 and 245 and the bond fingers 415 to each other. The wire bonds 235 connected to the die bond pads 225 configured to provide ground voltage GND may provide a shield function such that wire bonds 231 and 232 configured to transmit signals may not be affected by signal interference.

Figure 7:
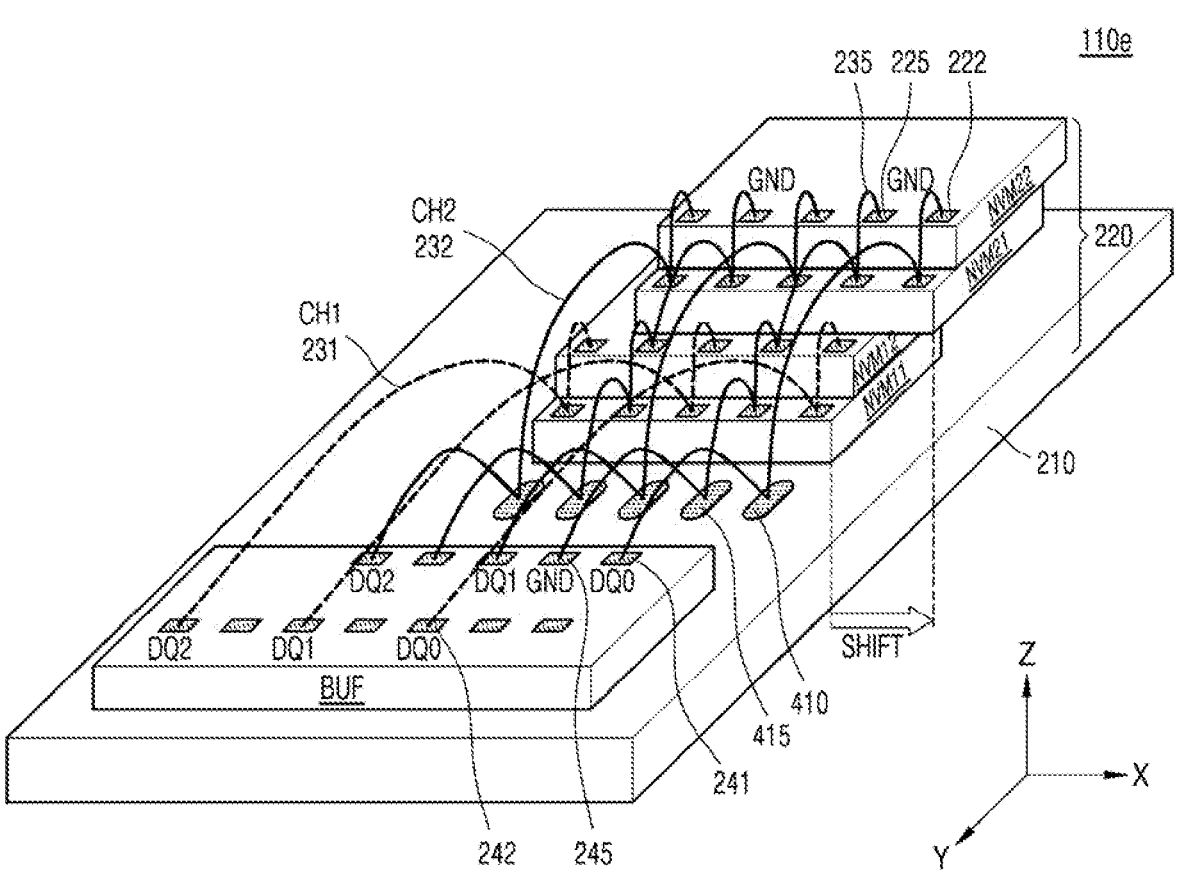

The semiconductor package 110e shown in FIG. 7 is substantially the same as the semiconductor package 100d shown in FIG. 6. However, unlike in the semiconductor package 100d shown in FIG. 6, in the semiconductor package 10e of the current embodiment, memory dies NVM11 and NVM12 of a first channel CH1 and memory dies NVM21 and NVM22 of a second channel CH2 may be stacked in a direction Z perpendicular to a package substrate 210 with a continuous offset stepped configuration in a first direction Y of the package substrate 210, and the group of memory dies NVM21 and NVM22 of the second channel CH2 may be shifted from the group of memory dies NVM11 and NVM12 of the first channel CH1 in a second direction X of the package substrate 210. In the semiconductor package 110e, the memory die group of the first channel CH1 and the memory die group of the second channel CH2 may be stacked in a stepped offset pattern for channel-to-channel connection with a buffer chip BUF (that is, for connection of the first channel CH1 to the buffer chip BUF and connection of the second channel CH2 to the buffer chip BUF). Therefore, occurrence of a short circuit between wire bonds 231 of the first channel CH1 and wire bonds 232 of the second channel CH2 may be additionally prevented.

Figure 8:
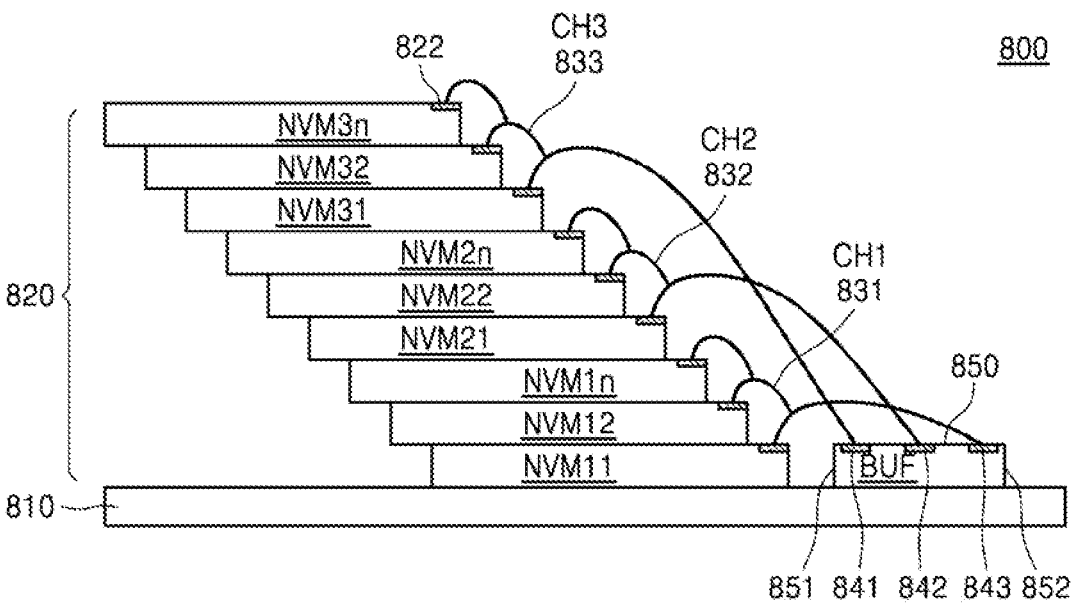
FIGS. 8 and 9 are views illustrating semiconductor packages according to example embodiments.
Figure 9:
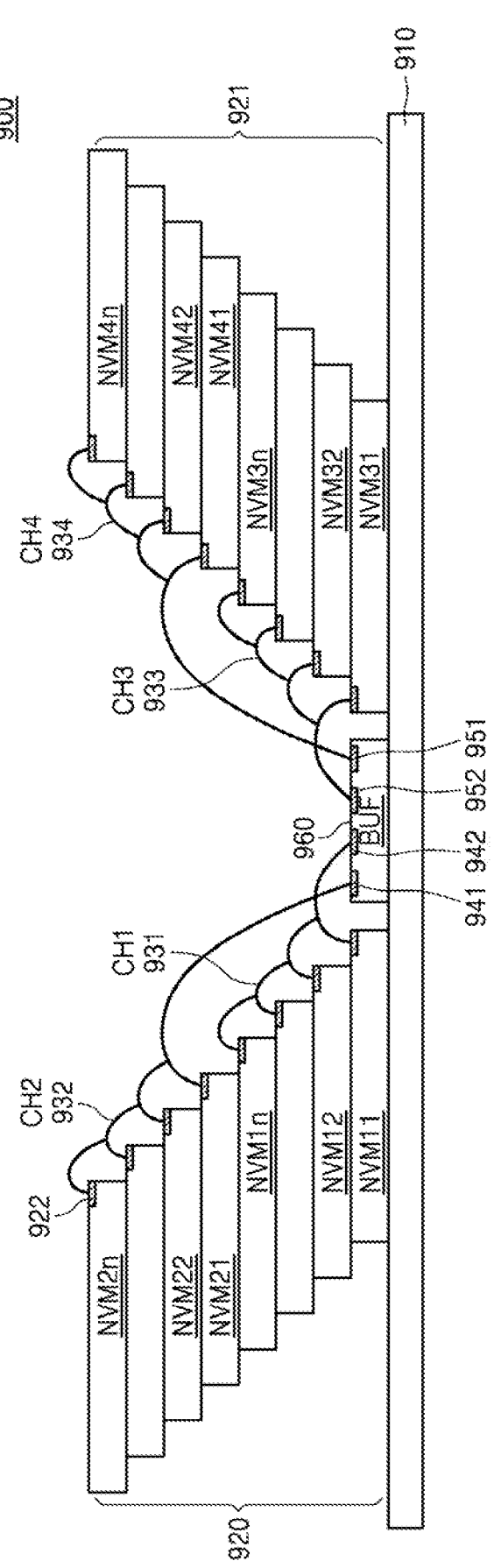

FIGS. 8 and 9 are views illustrating semiconductor packages 800 and 900 according to embodiments. FIGS. 8 and 9 are edge views of the semiconductor packages 800 and 900 each including the memory device 110 described with reference to FIG. 1.

Referring to FIGS. 1 and 8, the semiconductor package 800 may include a buffer chip BUF and a memory die stack 820 mounted on a package substrate 810. In the memory die stack 820, a first set of memory dies NVM11, NVM12, and NVM1$n$ connected to wire bonds 831 of a first channel CH1, a second set of memory dies NVM21, NVM22, and NVM2$n$ connected to wire bonds 832 of a second channel CH2, and a third set of memory dies NVM31, NVM32, and NVM3$n$ connected to wire bonds 833 of a third channel CH3 may be stacked in a continuous offset stepped configuration.

The memory dies NVM11, NVM12, NVM1$n$, NVM21, NVM22, NVM2$n$, NVM31, NVM32, and NVM3$n$ may include die bond pads 822 that are aligned with edges of the memory dies NVM11, NVM12, NVM1$n$, NVM21, NVM22, NVM2$n$, NVM31, NVM32, and NVM3$n$. The buffer chip BUF may be on the package substrate 810 at a distance from the memory die stack 820, and may include a plurality of die bond pads 841, 842, and 843 on a top surface 850 thereof. In the buffer chip BUF, a first set of die bond pads 841 may be arranged on a side of a first edge 851 of the buffer chip BUF that may be close to the memory die stack 820 a second set of die bond pads 842 may be arranged between the first set of die bond pads 841 and a third set of die bond pads 843 and the third set of die bond pads 843 may be arranged on a side of a second edge 852 of the buffer chip BUF that may be distant from the memory die stack 820.

In the memory die stack 820, the wire bonds 833 of the third channel CH3 may be longest, and the longest wire bonds 833 may be connected to the die bond pads 841 of the buffer chip BUF that may be arranged closest to the memory die stack 820. The wire bonds 831 of the first channel CH1 may be shortest, and the shortest wire bonds 831 may be connected to the die bond pads 843 of the buffer chip BUF that may be farthest from the memory die stack 820. The length of the wire bonds 832 of the second channel CH2 may be about halfway between the length of the longest wire bonds 833 and the length of the shortest wire bonds 831, and the mid-length wire bonds 832 may be connected to the die bond pads 842 between the die bond pads 841 and the die bond pads 843.

The semiconductor package 800 may include elements described with reference to FIGS. 3 to 7. In some embodiments, the semiconductor package 800 may include bond fingers arranged on the package substrate 810 between the buffer chip BUF and the memory die stack 820. The longest wire bonds 833 connected to the memory die stack 820 may be partially bonded to the bond fingers of the package substrate 810 and may extend such that the longest wire bonds 833 may be connected to the bond fingers and the die bond pads 841 of the buffer chip BUF. The longest wire bonds 833 may be connected to the die bond pads 841 of the buffer chip BUF via the bond fingers of the package substrate 810.

According to some embodiments, in the memory die stack 820, the memory dies NVM11, NVM12, and NVM1$n$ of the first channel CH1, the memory dies NVM21, NVM22, and NVM2$n$ of the second channel CH2, and the memory dies NVM31, NVM32, and NVM3$n$ of the third channel CH3 may each include die ground-voltage bond pads configured to provide ground voltage. The buffer chip BUF may include ground-voltage die bond pads configured to provide ground voltage. The ground-voltage die bond pads of the memory dies NVM11, NVM12, NVM1$n$, NVM21, NVM22, NVM2$n$, NVM31, NVM32, and NVM3$n$ may be connected to the ground-voltage die bond pads of the buffer chip BUF through wire bonds, and in this case, the wire bonds may be connected to the ground-voltage die bond pads of the buffer chip BUF via the bond fingers of the package substrate 810.

According to some embodiments, in the semiconductor package 800, the memory die group of the first channel CH1, the memory die group of the second channel CH2, and the memory die group of the third channel CH3 may be stacked in a stepped offset pattern for channel-to-channel connection with the buffer chip BUF (that is, for connection of the first channel CH1 to the buffer chip BUF, connection of the second channel CH2 to the buffer chip BUF, and connection of the third channel CH3 to the buffer chip BUF).

Referring to FIGS. 1 and 9, the semiconductor package 900 may include a buffer chip BUF, and first and second memory die stacks 920 mounted on a package substrate 810. The first memory die stack 920 may include a first set of memory dies NVM11, NVM12, and NVM1$n$ connected to wire bonds 931 of a first channel CH1, and a second set of memory dies NVM21, NVM22, and NVM2$n$ connected to wire bonds 932 of a second channel CH2, wherein the memory dies NVM11, NVM12, NVM1$n$, NVM21, NVM22, and NVM2$n$ may be stacked in a continuous offset stepped configuration. The second memory die stack 921 may include a third set of memory dies NVM31, NVM32, and NVM3n connected to the wire bonds 933 of a third channel CH3, and a fourth set of memory dies NVM41, NVM42, and NVM4n connected to wire bonds 934 of a fourth channel CH4, wherein the memory dies NVM31, NVM32, NVM3n, NVM41, NVM42, and NVM4n are stacked in a continuous offset stepped configuration.

The memory dies NVM11, NVM12, NVM1n, NVM21, NVM22, NVM2n, NVM31, NVM32, NVM3n, NVM41, NVM42, and NVM4n may include die bond pads 922 that may be aligned with edges of the memory dies NVM11, NVM12, NVM1n, NVM21, NVM22, NVM2n, NVM31, NVM32, NVM3n, NVM41, NVM42, and NVM4n. The buffer chip BUF may be on the package substrate 910 apart from the first and second memory die stacks 920 and 921, and may include a plurality of die bond pads 941, 942, 951, and 952 on a top surface 960 thereof. In the buffer chip BUF, first sets of die bond pads 941 and 951 may be arranged on sides of edges that are respectively close to the first and second memory die stacks 920 and 921, and second sets of die bond pads 942 and 952 may be arranged between the first sets of die bond pads 941 and 951.

In the first memory die stack 920, the wire bonds 932 of the second channel CH2 which are relatively long may be connected to the die bond pads 941 of the buffer chip BUF which are relatively close to the first memory die stack 920, and the wire bonds 931 of the first channel CH1 which are relatively short may be connected to the die bond pads 942 of the buffer chip BUF which are relatively distant from the first memory die stack 920. In the second memory die stack 921, the wire bonds 934 of the fourth channel CH4 which are relatively long may be connected to the die bond pads 951 of the buffer chip BUF which are relatively close to the second memory die stack 921, and the wire bonds 933 of the third channel CH3 which are relatively short may be connected to the die bond pads 952 of the buffer chip BUF which are relatively distant from the second memory die stack 921.

The semiconductor package 900 may include elements described with reference to FIGS. 3 to 7. In some embodiments, the semiconductor package 900 may include bond fingers arranged on the package substrate 910 between the buffer chip BUF and each of the first and second memory die stacks 920 and 921. The relatively long wire bonds 932 connected to the first memory die stack 920 may be partially bonded to the bond fingers of the package substrate 910 and may extend such that the relatively long wire bonds 932 may be connected to the bond fingers and the die bond pads 941 of the buffer chip BUF. The relatively long wire bonds 934 connected to the second memory die stack 921 may be partially bonded to the bond fingers of the package substrate 910 and may extend such that the relatively long wire bonds 934 may be connected to the bond fingers and the die bond pads 951 of the buffer chip BUF. The relatively long wire bonds 932 and 934 may be connected to the die bond pads 941 and 951 of the buffer chip BUF via the bond fingers of the package substrate 910.

According to some embodiments, in the first and second memory die stacks 920, 921, the memory dies NVM11, NVM12, and NVM1n of the first channel CH1, the memory dies NVM21, NVM22, and NVM2n of the second channel CH2, the memory dies NVM31, NVM32, and NVM3n of the third channel CH3, and the memory dies NVM41, NVM42, and NVM4n of the fourth channel CH4 may each include ground-voltage die bond pads configured to provide ground voltage. The buffer chip BUF may include ground-voltage die bond pads configured to provide ground voltage. The ground-voltage die bond pads of the memory dies NVM11, NVM12, NVM1n, NVM21, NVM22, NVM2n, NVM31, NVM32, NVM3n, NVM41, NVM42, and NVM4n may be connected to the ground-voltage die bond pads of the buffer chip BUF through wire bonds, and in this case, the wire bonds may be connected to the ground-voltage die bond pads of the buffer chip BUF via the bond fingers of the package substrate 910.

According to some embodiments, in the semiconductor package 900, the memory die groups of the first and second channels CH1 and CH2 of the first memory die stack 920 may be stacked in a stepped offset pattern for channel-to-channel connection with the buffer chip BUF, and the memory die groups of the third and fourth channels CH3 and CH4 of the second memory die stack 921 may be stacked in a stepped offset pattern for channel-to-channel connection with the buffer chip BUF.

Figure 10:
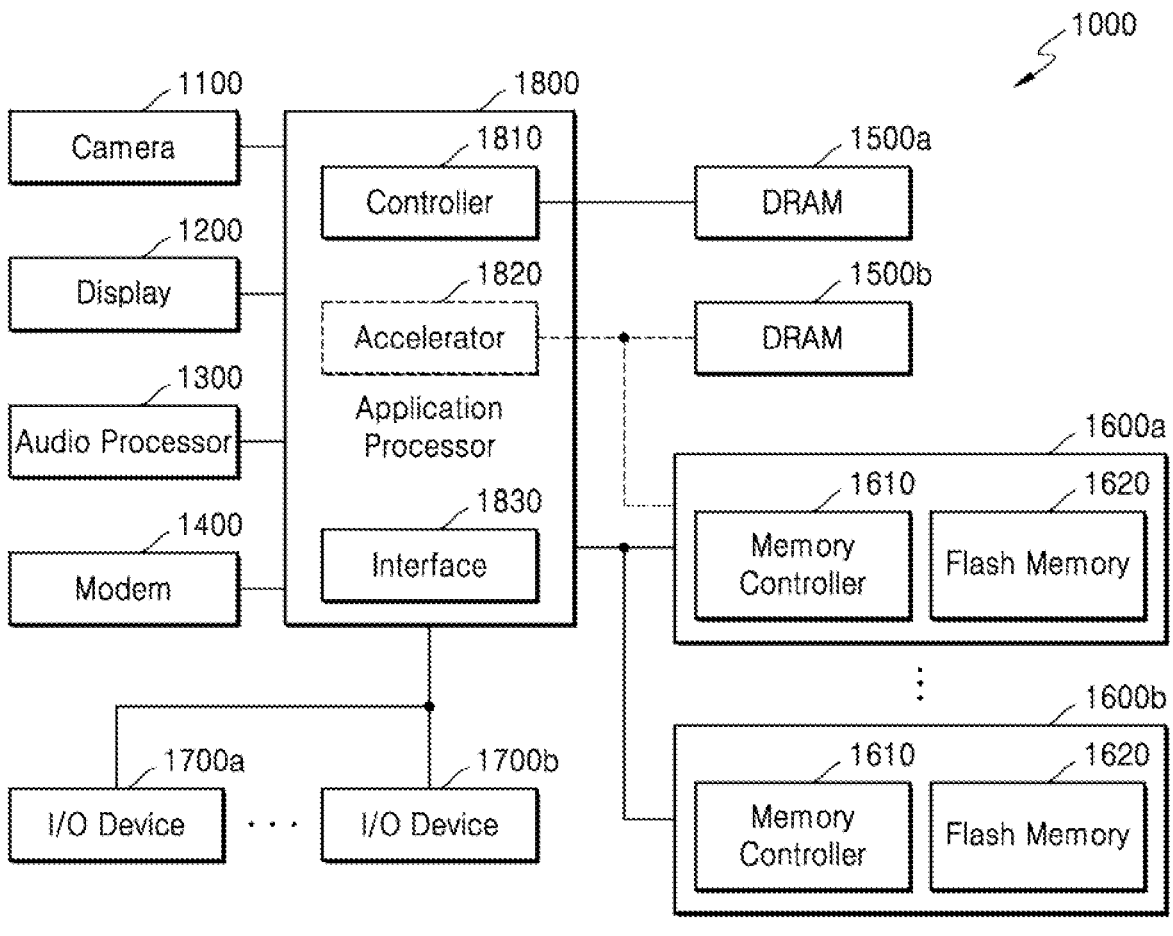
FIG. 10 is a block diagram of a system 1000 for illustrating an electronic device including a semiconductor package according to example embodiments.

FIG. 10 is a block diagram of a system 1000 for illustrating an electronic device including a semiconductor package according to embodiments. Referring to FIG. 10, the system 1000 may include a camera 1100, a display 1200, an audio processor 1300, a modem 1400, DRAMs 1500a and 1500b, flash memory devices 1600a and 1600b, I/O devices 1700a and 1700b, and an application processor (AP) 1800. The system 1000 may be implemented as a laptop computer, a mobile phone, a smartphone, a tablet personal computer (PC), a wearable device, a healthcare device, or an Internet of Things (IoT) device. In addition, the system 1000 may be implemented as a server or a PC.

The camera 1100 may capture a still image or a moving image under user control, and may store the captured image or image data or may transmit the captured image or image data to the display 1200. The audio processor 1300 may process audio data stored or included in the flash memory devices 1600a and 1600b or network content. The modem 1400 may modulate and transmit signals for wired/wireless data transmission, and may demodulate received signals to restore original signals. The I/O devices 1700a and 1700b may include devices having digital input and/or output functions, such as a universal serial bus (USB) device, a storage, a digital camera, a SD card, a digital versatile disc (DVD), a network adapter, or a touch screen.

The AP 1800 may control overall operations of the system 1000. The AP 1800 may control the display 1200 to display some of content stored in the flash memory devices 1600a and 1600b. When a user input is received through the I/O devices 1700a and 1700b, the AP 1800 may perform a control operation corresponding to the user input. The AP 1800 may include a controller block 1810, an accelerator 1820 (e.g., an accelerator block that is a dedicated circuit for data operation or an accelerator chip apart from the AP 1800) and an interface block 1830. The DRAM 1500b may be mounted on the accelerator block or the accelerator 1820. The accelerator 1820 may include a functional block specialized in performing a specific function of the AP 1800, such as a graphics processing unit (GPU) specialized in graphic data processing, a neural processing unit (NPU) specialized in AI calculation and inference, or a data processing unit (DPU) specialized in data transmission.

The system 1000 may include the DRAMs 1500a and 1500b. The AP 1800 may control the DRAMs 1500a and 1500b through commands and mode register sets (MRSs) conforming to Joint Electron Device Engineering Council (JEDEC) standards, or may communicate with the DRAMs 1500a and 1500b by setting DRAM interface rules to use company's unique functions such as low-voltage/high-speed/reliability functions and cyclic redundancy check (CRC)/error correction code (ECC) functions. In an implementation, the AP 1800 may communicate with the DRAM 1500a through an interface conforming to JEDEC standards such as low power double data rate (LPDDR) 4 or LPDDR5, and the accelerator block or the accelerator 1820 may communicate with the DRAM 1500b by setting a new DRAM interface protocol to control the DRAM 1500b that is provided for the accelerator block or the accelerator 1820 and has a higher bandwidth than the DRAM 1500a.

In the exemplary embodiment of FIG. 10 the DRAMs 1500a and 1500b are illustrated. Any memories such as PRAM, static RAM (SRAM), MRAM, RRAM, FRAM or Hybrid RAM may be used as long as the memories satisfy the bandwidth, response speed, and voltage conditions of the AP 1800 or the accelerator 180. The DRAMs 1500a and 1500b have lower latency and smaller bandwidth than the I/O devices 1700a and 1700b or the flash memory devices 1600a and 1600b. The DRAMs 1500a and 1500b may be initialized when the system 1000 is powered on, and may then be used as temporary storages into which data of an operating system and applications may be loaded or as execution spaces in which various software codes may be executed.

In the DRAMs 1500a and 1500b, addition/subtraction/multiplication/division operations, vector operations, address operations, or fast Fourier transform (FFT) operations may be performed. In addition, a function for inference may be performed in the DRAMs 1500a and 1500b. Here, inference may be performed in a deep learning algorithm using an artificial neural network. The deep learning algorithm may include a training operation for training a model using various pieces of data and an inference operation for recognizing data with the trained model. In an embodiment, an image captured by a user with the camera 1100 may be signal processed and stored in the DRAM 1500b, and the accelerator block or the accelerator 1820 may perform a data-recognizing AI data operation by using data stored in the DRAM 1500b and the function for inference.

The system 1000 may include a plurality of storages or the flash memory devices 1600a and 1600b having greater capacity than the DRAMs 1500a and 1500b. The accelerator block or the accelerator 1820 may perform training operations and AI data calculations using the flash memory devices 1600a and 1600b. In an embodiment, the flash memory devices 1600a and 1600b may each include a memory controller 1610 and a flash memory 1620, and the AP 1800 and/or the accelerator 1820 may efficiently perform training operations and inference AI data calculations by using an arithmetic unit included in the memory controller 1610. The flash memory devices 1600a and 1600b may store pictures captured using the camera 1100 or data received through a data network. In an implementation, the flash memory devices 1600a and 1600b may store augmented reality/virtual reality, high definition (HD), or ultra-high definition (UHD) content.

The DRAMs 1500a and 1500b and/or the flash memory devices 1600a and 1600b of the system 1000 may include the semiconductor packages described with reference to FIGS. 1 to 9. The semiconductor packages of the DRAMs 1500a and 1500b and/or the flash memory devices 1600a and 1600b may each include a buffer chip that may be wire-bonded to a memory die stack(s) to optimize routing of wire bond connections. The memory die stack may include a first set of memory dies connected through a first set of wire bonds and a second set of memory dies connected through a second set of wire bonds, wherein the second set of memory dies may be on the first set of memory dies. The second set of wire bonds that are relatively long may extend such that the second set of wire bonds may be connected to a first set of die bond pads of the buffer chip that may be relatively close to the memory die stack, and the first set of wire bonds that are relatively short may extend such that the first set of wire bonds may be connected to a second set of die bond pads of the buffer chip that may be relatively distant from the memory die stack. In the semiconductor package, the first set of wire bonds and the second set of wire bonds that are connected between the buffer chip and the memory die stack may have uniform electrical characteristics such as resistance and capacitance and may thus provide optimal electrical connections.

By way of summation and review, a semiconductor package including a buffer chip that is wire-bonded to memory dies to improve routing of wire bond connections is disclosed.

A multi-chip package (MCP) in which a plurality of memory dies are stacked may be used to provide a high-integration, high-capacity memory device. In an MCP in which a plurality of memory dies are stacked, electrical connections may be implemented by connecting the memory dies to each other and to a package substrate by a wire bond scheme.

As the number of memory dies stacked in an MCP increases, the height of a memory die stack increases. As the height of the memory die stack increases, the length of wire bonds connecting the memory dies to each other also increases. However, as the length of the wire bonds increases, the electrical characteristics of signals transmitted through the wire bonds may deteriorate.

When it is possible to improve wire bond connections by considering the height of a memory die stack and the length of wire bonds, the signal characteristics and/or performance of an MCP semiconductor device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package comprising:
   a package substrate;
   a semiconductor die stack which is mounted on the package substrate and in which one or more semiconductor dies are stacked, the semiconductor die stack including a first set of semiconductor dies and a second set of semiconductor dies on the first set of semiconductor dies;
   a first set of wire bonds connecting the first set of semiconductor dies to each other;
   a second set of wire bonds connecting the second set of semiconductor dies to each other; and
   a buffer chip mounted on the package substrate and including a first set of die bond pads and a second set of die bond pads, the first set of die bond pads being close to the semiconductor die stack, the second set of die bond pads being distant from the semiconductor die stack, wherein the second set of wire bonds is connected to the first set of die bond pads of the buffer chip, and the first set of wire bonds is connected to the second set of die bond pads of the buffer chip.

2. The semiconductor package as claimed in claim 1, wherein the buffer chip is on the package substrate at a distance from the semiconductor die stack, and the package substrate includes bond fingers between the buffer chip and the semiconductor die stack.

3. The semiconductor package as claimed in claim 2, wherein the second set of wire bonds is partially bonded to the bond fingers and is connected to the first set of die bond pads of the buffer chip.

4. The semiconductor package as claimed in claim 2, further comprising a third set of wire bonds connecting the first set of semiconductor dies and the second set of semiconductor dies to each other, wherein the buffer chip further includes a third set of die bond pads providing ground voltage, and the third set of wire bonds is connected to the third set of die bond pads of the buffer chip.

5. The semiconductor package as claimed in claim 4, wherein the third set of wire bonds is partially bonded to the bond fingers and is connected to the third set of die bond pads of the buffer chip.

6. The semiconductor package as claimed in claim 1, wherein the package substrate includes a first side surface in a first direction and a second side surface opposite the first side surface, and the one or more semiconductor dies of the semiconductor die stack are stacked in a continuous offset stepped configuration along the first side surface in the first direction.

7. The semiconductor package as claimed in claim 6, wherein, in the semiconductor die stack, a group of the second set of semiconductor dies is shifted from a group of the first set of semiconductor dies in a second direction perpendicular to the first direction.

8. A semiconductor package comprising:

a package substrate;

a semiconductor die stack which is mounted on the package substrate and in which one or more semiconductor dies are stacked, the semiconductor die stack including a first set of semiconductor dies, a second set of semiconductor dies on the first set of semiconductor dies, and a third set of semiconductor dies on the second set of semiconductor dies;

a first set of wire bonds connecting the first set of semiconductor dies to each other;

a second set of wire bonds connecting the second set of semiconductor dies to each other;

a third set of wire bonds connecting the third set of semiconductor dies to each other; and a buffer chip mounted on the package substrate and including a first set of die bond pads, a second set of die bond pads, and a third set of die bond pads, the first set of die bond pads being close to the semiconductor die stack, the second set of die bond pads being between the first set of die bond pads and the third set of die bond pads, the third set of die bond pads being distant from the semiconductor die stack, wherein the third set of wire bonds is connected to the first set of die bond pads of the buffer chip, the second set of wire bonds is connected to the second set of die bond pads of the buffer chip, and the first set of wire bonds is connected to the third set of die bond pads of the buffer chip.

9. The semiconductor package as claimed in claim 8, wherein the buffer chip is on the package substrate at a distance from the semiconductor die stack, and the package substrate includes bond fingers between the buffer chip and the semiconductor die stack.

10. The semiconductor package as claimed in claim 9, wherein the third set of wire bonds is partially bonded to the bond fingers and is connected to the first set of die bond pads of the buffer chip.

11. The semiconductor package as claimed in claim 9, further comprising a fourth set of wire bonds connecting the first set of semiconductor dies, the second set of semiconductor dies, and the third set of semiconductor dies to each other, wherein the buffer chip further includes a fourth set of die bond pads providing ground voltage, and the fourth set of wire bonds is connected to the fourth set of die bond pads of the buffer chip.

12. The semiconductor package as claimed in claim 11, wherein the fourth set of wire bonds is partially bonded to the bond fingers and is connected to the fourth set of die bond pads of the buffer chip.

13. The semiconductor package as claimed in claim 8, wherein the package substrate includes a first side surface in a first direction and a second side surface opposite the first side surface, and the one or more semiconductor dies of the semiconductor die stack are stacked in a continuous offset stepped configuration along the first side surface in the first direction.

14. A semiconductor package comprising:

a package substrate including a first side surface in a first direction and a second side surface opposite the first side surface;

first and second semiconductor die stacks each mounted on the package substrate and in which one or more semiconductor dies are stacked, the second semiconductor die stack being apart from the first semiconductor die stack in the first direction, the first semiconductor die stack including a first set of semiconductor dies and a second set of semiconductor dies on the first set of semiconductor dies, the second semiconductor die stack including a third set of semiconductor dies and a fourth set of semiconductor dies on the third set of semiconductor dies;

a first set of wire bonds connecting the first set of semiconductor dies to each other;

a second set of wire bonds connecting the second set of semiconductor dies to each other;

a third set of wire bonds connecting the third set of semiconductor dies to each other;

a fourth set of wire bonds connecting the fourth set of semiconductor dies to each other; and a buffer chip mounted on the package substrate and including a first set of die bond pads, a second set of die bond pads, a third set of die bond pads, and a fourth set of die bond pads, the first set of die bond pads being close to the first semiconductor die stack, the second set of die bond pads being distant from the first semiconductor die stack, the third set of die bond pads being close to the second semiconductor die stack, the fourth set of die bond pads being distant from the second semiconductor die stack, wherein the second set of wire bonds is connected to the first set of die bond pads of the buffer chip, the first set of wire bonds is connected to the second set of die bond pads of the buffer chip, the fourth set of wire bonds is connected to the third set of die bond pads of the buffer chip, and the third set of wire bonds is connected to the fourth set of die bond pads of the buffer chip.

15. The semiconductor package as claimed in claim 14, wherein the buffer chip is on the package substrate between the first semiconductor die stack and the second semiconductor die stack, and the package substrate includes bond fingers between the buffer chip and the first semiconductor die stack and between the buffer chip and the second semiconductor die stack.

16. The semiconductor package as claimed in claim 15, wherein the second set of wire bonds is partially bonded to the bond fingers and is connected to the first set of die bond pads of the buffer chip, and the fourth set of wire bonds is partially bonded to the bond fingers and is connected to the third set of die bond pads of the buffer chip.

17. The semiconductor package as claimed in claim 15, further comprising:

a fifth set of wire bonds connecting the first set of semiconductor dies and the second set of semiconductor dies to each other; and a sixth set of wire bonds connecting the third set of semiconductor dies and the fourth set of semiconductor dies to each other, wherein the buffer chip further includes a fifth set of die bond pads providing ground voltage, and the fifth set of wire bonds and the sixth set of wire bonds each extend to be connected to the fifth set of die bond pads of the buffer chip.

18. The semiconductor package as claimed in claim 17, wherein the fifth set of wire bonds and the sixth set of wire bonds are partially bonded to the bond fingers and each extend to be connected to the fifth set of die bond pads of the buffer chip.

19. The semiconductor package as claimed in claim 14, wherein the one or more semiconductor dies of the first semiconductor die stack are stacked in a continuous offset stepped configuration along the first side surface in the first direction, and the one or more semiconductor dies of the second semiconductor die stack are stacked in a continuous offset stepped configuration along the second side surface in the first direction.

20. The semiconductor package as claimed in claim 14, wherein, in the first semiconductor die stack, a group of the second set of semiconductor dies is shifted from a group of the first set of semiconductor dies in a second direction perpendicular to the first direction, and in the second semiconductor die stack, a group of the fourth set of semiconductor dies is shifted from a group of the third set of semiconductor dies in the second direction.

* * * * *